(12) United States Patent
Ross

(10) Patent No.: US 11,929,540 B2
(45) Date of Patent: Mar. 12, 2024

(54) ELECTROMAGNETIC COUPLER INCLUDING SPACED APART COUPLED CONDUCTORS HAVING INNER EDGES WITH ALTERNATING CONVEX AND CONCAVE ARCUATE FORMATIONS

(71) Applicant: BAE Systems Australia Limited, Edinburgh (AU)

(72) Inventor: Michel A Ross, Craigburn Farm (AU)

(73) Assignee: BAE Systems Australia Limited, Edinburgh (AU)

( * ) Notice: Subject to any disclaimer, the term of this patent is extended or adjusted under 35 U.S.C. 154(b) by 616 days.

(21) Appl. No.: 17/253,707

(22) PCT Filed: Jun. 20, 2019

(86) PCT No.: PCT/AU2019/050634
§ 371 (c)(1),
(2) Date: Dec. 18, 2020

(87) PCT Pub. No.: WO2019/241843
PCT Pub. Date: Dec. 26, 2019

(65) Prior Publication Data
US 2021/0242560 A1 Aug. 5, 2021

(30) Foreign Application Priority Data
Jun. 21, 2018 (AU) ................ 2018902223

(51) Int. Cl.
*H01P 5/18* (2006.01)
*H05K 1/02* (2006.01)

(52) U.S. Cl.
CPC .............. *H01P 5/185* (2013.01); *H01P 5/184* (2013.01); *H05K 1/0237* (2013.01); *H05K 2201/09263* (2013.01)

(58) Field of Classification Search
CPC .............. H01P 5/185; H01P 5/184; H01P 5/18
USPC .......................................... 333/116
See application file for complete search history.

(56) References Cited

U.S. PATENT DOCUMENTS 3,629,733 A 12/1971 Podell
5,373,266 A 12/1994 Lenzing et al.
5,818,308 A * 10/1998 Tanaka et al. .......... H01P 5/185
333/116

(Continued)

FOREIGN PATENT DOCUMENTS

JP S52129442 U 10/1977

OTHER PUBLICATIONS

European Search Report for PCT Application No. 19822198.8, dated Feb. 16, 2022, 16 pages.

(Continued)

*Primary Examiner* — Benny T Lee
(74) *Attorney, Agent, or Firm* — Maine Cernota & Curran

(57) ABSTRACT

An electromagnetic coupler including: a substrate; and a first conductor mounted to the substrate for receiving a first electromagnetic signal, the first conductor having a first multiple arcuate edge; a second conductor mounted to the substrate, the second conductor being spaced apart from the first conductor and having a second multiple arcuate edge that is opposed to the first edge for generating in the second conductor a second electromagnetic signal that is derived from the first electromagnetic signal.

17 Claims, 3 Drawing Sheets

(56) References Cited

U.S. PATENT DOCUMENTS 7,378,919 B2* 5/2008 Zimmerling .............. H01P 1/02
333/246
2018/0083336 A1 3/2018 Weale

OTHER PUBLICATIONS

De Ronde, F.C.: "Wide-Band High Directivity in MIC Proximity Couplers by Planar Means", Microwave Symposium Digest, 1980 IEEE MTT-S International, IEEE, Piscataway, NJ, USA, May 28, 1980 (May 28, 1980), pp. 480-482, XP03166689.
Uysal S et al: "Nonuniform Transmission Line Codirectional Couplers for Hybrid Mimic and Superconductive Applications", IEEE Transactions on Microwave Theory and Techniques, IEEE, USA, vol. 42, No. 3, Mar. 1, 1994 (Mar. 1, 1944), pp. 407-413, XP000439463.
De Ronde, F.C.: Recent Developments in Broadband Directional Couplers on Microstrip, Microwave Symposium, 1972 IEEE GMTT International, IEEE, Piscataway, NJ, USA, May 22, 1972 (May 22, 1972), pp. 215-217, XP031665742.
Lau, D et al: "Broadband microstrip coupler for MMICs", High Frequency Postgraduate Student Colloquium, 1977 Leeds, UK Sep. 19, 1997, New York, NY USA, IEEE, US, Jan. 1, 1997 (Jan. 1, 1997), pp. 137-142, XP010267005, DOI: 10.1109/HFPSC.1997.651671, ISBN: 978-0-7803-3951-4.
Search Report for PCT Appl. No. PCT/AU2019/050634, dated Jul. 8, 2019, 3 Pages.
Zhou, M. Et al. "Optimal Model for Wiggly Coupled Microstrips in Directional Coupler and Schiffman Phase Shifter", Piers Online, vol. 3, No. 2, 2007. Entire Document.
International Preliminary Report on Patentability for PCT Appl. No. PCT/AU2019/050634, dated Dec. 22, 2020, 5 Pages.
Written Opinion for PCT Appl. No. PCT/AU2019/050634 dated Jul. 8, 2019, 4 Pages.

* cited by examiner

ELECTROMAGNETIC COUPLER INCLUDING SPACED APART COUPLED CONDUCTORS HAVING INNER EDGES WITH ALTERNATING CONVEX AND CONCAVE ARCUATE FORMATIONS

RELATED APPLICATIONS

This application is a national phase application filed under 35 USC § 371 of PCT Application No. PCT/AU2019/050634 with an International filing date of Jun. 20, 2019, which claims priority of Australian Patent Application 2018902223 filed Jun. 21, 2018. Both of these applications are incorporated herein by reference in their entirety for all purposes.

FIELD OF THE INVENTION

The present invention relates to a coupler and in particular to an electromagnetic coupler.

The invention has been developed primarily for RF signal sampling using a broadband non-uniform coupler and will be described herein with reference to that application. However, the invention is not limited to that particular field of use and is also suitable for many other uses.

BACKGROUND OF THE INVENTION

Any discussion of the prior art throughout the specification should in no way be considered as an admission that such prior art is widely known or forms part of the common general knowledge in the field.

Directional electromagnetic couplers are passive electromagnetic devices commonly used for signal sampling or signal combining in radio frequency circuitry. Known couplers typically include a pair of unshielded transmission lines or conductors set close enough together such that a portion of electromagnetic energy passing through one of the lines is coupled to the other. The power coupled varies as a function of the physical dimensions of the coupler and the bandwidth of a uniform, single-section, quarter-wave coupler is approximately one octave. The bandwidth and flatness may be increased by expanding the single-section coupler to multiple sections. However, at higher frequencies, the discontinuities between sections degrade coupler performance. The use of non-uniform lines with a smooth change in dimensions eliminates this problem.

Symmetric coupled-line structures support two propagation modes, odd and even. The interaction between these two modes induces coupling between the two transmission lines. The velocities of propagation of the odd and even modes are equal when the lines are embedded in a homogenous dielectric medium. Because the dielectric medium of micro-strip coupled lines is non-homogeneous, the odd and even mode velocities are unequal which results in poor directivity. The odd mode is defined when the two lines are driven out-of-phase from equal sources of equal impedances and voltages. The odd mode velocity for a micro-strip coupler tends to be higher than the even mode velocity. To improve directivity the odd mode velocity must be slowed. This may be accomplished by a dielectric overlay, lumped capacitor compensation or by profiling of the inner edges of the transmission lines to create "wiggly" inner edges. The profiling is usually in the form of rectangular, triangular or sawtooth formations, typically arranged in an interdigitated structure. The design of these formations, and the underlying mathematics used, is intended to equalise the even and odd mode phase velocities of the electromagnetic signals being coupled.

While some advantage has been gained through the use of the known couplers with wiggly edges, these couplers also tend to have limited power handling capabilities.

SUMMARY OF THE INVENTION

It is an object of the preferred embodiments of the present invention to overcome or ameliorate at least one of the disadvantages of the prior art, or to provide a useful alternative.

According to an aspect of the invention there is provided an electromagnetic coupler including: a substrate; and a pair of spaced apart electromagnetically coupled conductors mounted on the substrate, wherein each conductor includes: at least one connector for providing or receiving an electromagnetic signal; and a smooth wiggly inner edge for substantially equalising even and odd-mode velocities of the electromagnetic signal.

According to a further aspect of the invention there is provided an electromagnetic coupler including: a substrate; and a first conductor mounted to the substrate for receiving a first electromagnetic signal, the first conductor having a first multiple arcuate edge; a second conductor mounted to the substrate, the second conductor being spaced apart from the first conductor and having a second multiple arcuate edge that is opposed to the first edge for generating in the second conductor a second electromagnetic signal that is derived from the first electromagnetic signal.

Preferably, the first edge and the second edges are substantially complementary.

The first and second conductors preferably follow respective curved paths.

Preferably, the curved paths follow a compound curve.

The first edge is preferably defined by a plurality of arcuate formations.

Preferably, each of the arcuate formations adjoins with at least one of the other arcuate formations.

At least two of the arcuate formations are preferably separated by a generally linear formation.

Preferably, the first and second edges substantially equalise even and odd-mode velocities for the electromagnetic signals.

According to a further aspect of the invention there is provided an electromagnetic coupler including: a substrate; and a first conductor mounted to the substrate for receiving a first electromagnetic signal, the first conductor having a first edge including a first plurality of connected arcuate formations; a second conductor mounted to the substrate, the second conductor being spaced apart from the first conductor and having a second edge that is opposed to the first edge and includes a second plurality of connected arcuate formations, wherein: the first conductor and second conductor are configured such that a second electromagnetic signal is generated in the second conductor; and the second electromagnetic signal is derived from the first electromagnetic signal.

Preferably, the first edge and second edge are configured for substantially equalising even and odd-mode velocities of the electromagnetic signal.

The arcuate formations are preferably substantially circular arcs.

Preferably, the first conductor follows a first path and the second conductor follows a second path that is substantially coextensive with the first path.

The first and second paths are preferably linear.

Preferably, the first and second paths are curved.

The first plurality of arcuate formations and the second plurality of arcuate formations preferably have a substantially common predetermined periodicity.

Preferably, the predetermined periodicity varies along the path.

The first edge and the second edge are preferably substantially complementarily opposed with each other.

Preferably, the first and second edges are interdigitated with each other.

At least one pair of the arcuate formations are preferably separated by a linear portion.

Preferably, alternate arcuate formations of each edge are of substantially the same radius of curvature.

The first edge and the second edge are preferably smoothly contoured with a continuous gradient.

Preferably, the smooth wiggly inner edges are smoothly contoured with a continuous gradient.

BRIEF DESCRIPTION OF THE DRAWINGS

A preferred embodiment of the invention will now be described, by way of example only, with reference to the accompanying drawings, where like features are denoted by the same reference label throughout the detailed description of the drawings, in which.

DETAILED DESCRIPTION OF THE INVENTION

Although the invention has been described with reference to specific examples, it will be appreciated by those skilled in the art that the invention may be embodied in many other forms.

Figure 1:
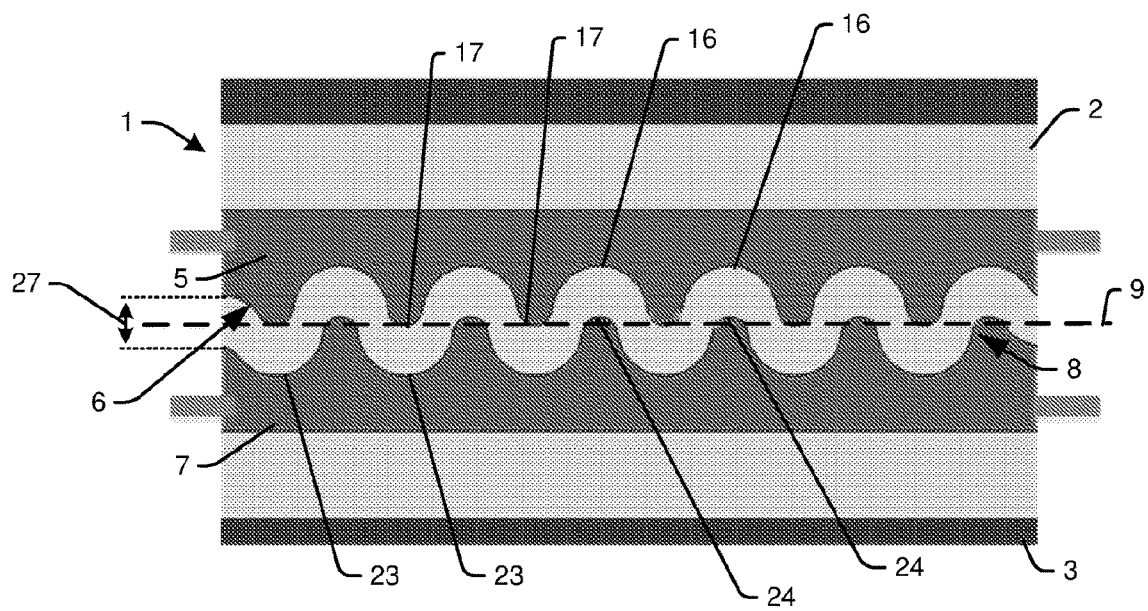
FIG. 1 is a plan view of a segment of a directional line coupler according to an embodiment of the invention.

Referring to FIG. 1 there is illustrated a segment of a directional line coupler 1 for operating in the RF range of electromagnetic frequencies. Coupler 1 includes a substrate in the form of a substantially planar upper surface 2 of a flat, single layer PCB 3. A first conductor, in the form of a first generally linear copper conductive strip 5, is mounted to surface 2 for receiving a first electromagnetic signal in the form of a first RF signal. Strip 5 has a first multiple arcuate edge 6, where the term "multiple arcuate" is used herein to refer to an edge comprising a plurality of interleaved convex and concave curves. In the illustrated example, edge 6 is a compound curve, in that the edge 6 is formed by a plurality of interconnected geometric "formations," i.e. geometric curved shapes, such that edge 6 has a smooth contour, in that the smooth contour has a gradient, i.e. a first derivative, that is continuous. In the illustrated embodiment, the "geometric formations" are interleaved, i.e. alternated, convex and concave half-circles. In other embodiments, the arcuate formations are one, or a combination of, sinusoids, parabolas, or other geometric shapes. So as to ensure that the "gradient" of the curve is continuous, it is only necessary that the gradients, i.e. the first derivatives, of adjacent geometric formations at their interconnected end points be equal to each other. In edge 6, the gradients of the half-circle formations are vertical at the points of interconnection, thereby providing smooth transitions between each pair of adjacent, alternating convex and concave half-circles.

A second conductor, in the form of a second generally linear metal conductive strip 7, is also mounted to surface 2 and is generally parallel and coextensive with strip 5. Strip 7 is spaced apart from the first conductor and has a second multiple arcuate edge 8 that is spaced apart from and opposed to edge 6 for generating in strip 7 a second electromagnetic signal in the form of a second RF signal that is derived from the first RF signal.

Strips 5 and 7 are spaced apart and co-extend generally longitudinally along a linear path 9 on surface 2 which bisects the two strips 5 and 7. In other embodiments, the path is curved. For example, on one such embodiment path 9 extends along a compound curve. In further embodiments, path 9 extends along both curved and linear portions and this will be described further below with reference to FIG. 4.

It will be appreciated that edges 6 and 8 are separated from each other, where that separation determines a coupling ratio achievable by coupler 1 with a smaller separation providing a higher coupling ratio. In other embodiments of the invention different separations are used to provide a different coupling ratio to that achieved by coupler 1.

In this embodiment coupler 1 is designed for coupling first and second signals in the range of 800 MHz to 18 GHz. In other embodiments coupler 1 is configured for use with other frequency bands. In general, the size of the formations will determine the maximum operating frequency with smaller formations corresponding to a higher maximum frequency.

Edge 6 comprises a first set of connected arcuate formations. In particular, the first set includes a first subset of generally semi-circular concave arcuate formations 16 (only two of which are explicitly numbered). The first set also includes a second subset of generally semi-circular convex arcuate formations 17 (only two of which are explicitly numbered) that alternate with formations 16 and join at interconnecting inflection points such that edge 6 is continuous. Formations 16 have a common radius of curvature which, in this embodiment, is about 0.5 mm, and centres that are aligned longitudinally at a uniform offset to the broken line illustrating path 9. Formations 17 have a common radius of curvature which, in this embodiment, is about 0.1 mm, and centres that are aligned longitudinally at a different uniform offset to the broken line illustrating path 9 such that the minimum spacing between lines is 0.2 mm. These dimensions provide the tightest coupling with the odd mode propagation velocity slowed to approximately equal the even mode velocity to improve directivity. It will be appreciated that the radius of curvature of formations 16 is generally larger than the radius of curvature of formations 17 and the offset of the centres of formations 16 from the line illustrating path 9 is substantially the same as the offset for formations 17 and is consistent along path 9. In some embodiments, the offset of the centres from path 9 varies with position along the path.

Edge 8 is generally of similar design to edge 6 and includes a second set, also having a first and second sub-sets, of connected arcuate formations that are similar to the first and second subsets of the first set. In particular, edge 8 includes connected arcuate formations 23 and 24 (only two each of which are explicitly numbered) which are substantially the same as respective arcuate formations 16 and 17 of edge 6. Formations 23 of edge 8 are longitudinally offset along path 9 in comparison to formations 16 of edge 6 such that formations 23 are transversely opposed to formations 17. In this embodiment, formations 24 are interdigitated with formations 17 as those formations extend transversely across path 9. In some embodiments, formations 16, 17, 23 and 24 are located such that a distance 27 between edges 6 and 8, measured in a direction perpendicular to the edge, is substantially constant.

As mentioned above, formations 17 and 24 extend transversely toward the respective opposing edges 6 and 8, and terminate on the distal side of path 9. In further embodiments, such as that shown in FIG. 2, formations 17 and 24 do not extend as far as the path 9 and are hence not interdigitated. In still further embodiments, at least some of the formations 17 and 24 are interdigitated, whereas others are not.

Figure 2:
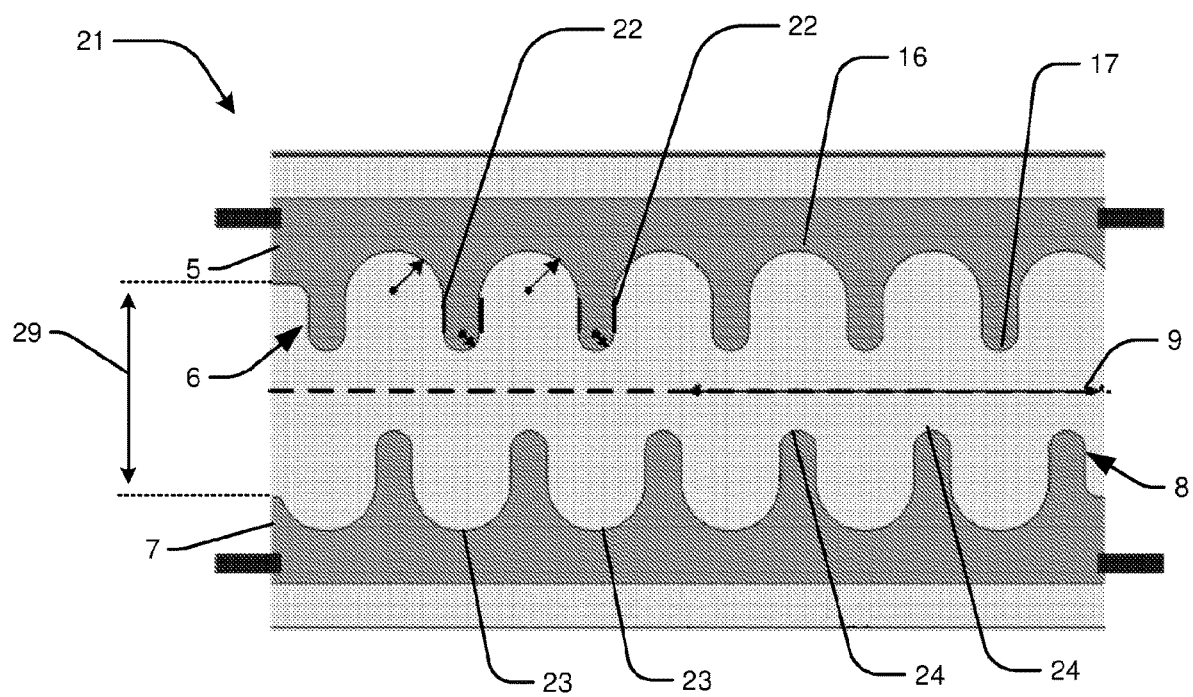
FIG. 2 is a plan view of a segment of a directional line coupler according to another embodiment of the invention.

It will be appreciated that in the above embodiment strips 5 and 7 follow a generally linear longitudinal path 9 and formations 16 and 17, which define edge 6, and formations 23 and 24, which define edge 8, are uniformly and consistently alternated along the longitudinal length of those edges. These same design principles are included in a further coupler 21, which is illustrated in FIG. 2 and where corresponding reference numerals designate corresponding features. Coupler 21 includes a third set of formations, being straight line formations 22 (only two of which are explicitly numbered) connecting convex arcuate formations 17 to adjacent concave arcuate formations 16. Formations 22 adjoin each of the generally semi-circular portions 16 and 17 in a tangential manner such that edge 6 defines a smooth contour. Formations 22 act to increase an aspect ratio of formations 16 and 23. Coupler 21 also includes an increased separation between edges 6 and 8 such that formations 17 and 24 do not extend transversely as far as the path 9 in spite of the increased aspect ratio. It will be appreciated that the separation between edges 6 and 8 is not wholly dependent on the aspect ratio of formations 16, 17, 23 and 24 and, in general, the two parameters can be varied independently. In this embodiment, the offset of the centres of formations 16 from the line illustrating path 9 is greater than the offset for formations 17 and the respective offsets are consistent along path 9. The larger separation 29 results in a reduced coupling ratio compared to coupler 1 and a corresponding increase in the odd mode phase velocity. To equalise the even and odd mode phase velocities, the aspect ratio of formations is increased. In other embodiments, such as that illustrated in FIG. 4, the offsets of the centres from path 9 vary with position along the path.

The first edge 6 and second edge 8 are configured for substantially equalising even and odd mode velocities of the electromagnetic signal. The effect is achieved by the increased length of the edges 6 and 8 relative to path 9, wherein the length of the edges 6 and 8 is defined as the total perimeter of the formations 16, 17, 23, 24 and 22 (if present) combined. It will be appreciated that the length of edges 6 and 8 can be controlled by altering the aspect ratio of formations 17 and 23 thereby providing a design parameter for equalising even and odd mode velocities of the electromagnetic signal.

In some embodiments, the radii of the semi-circular formations 16, 17, 23 and 24 varies along the respective edges 6 and 8.

Figure 3:
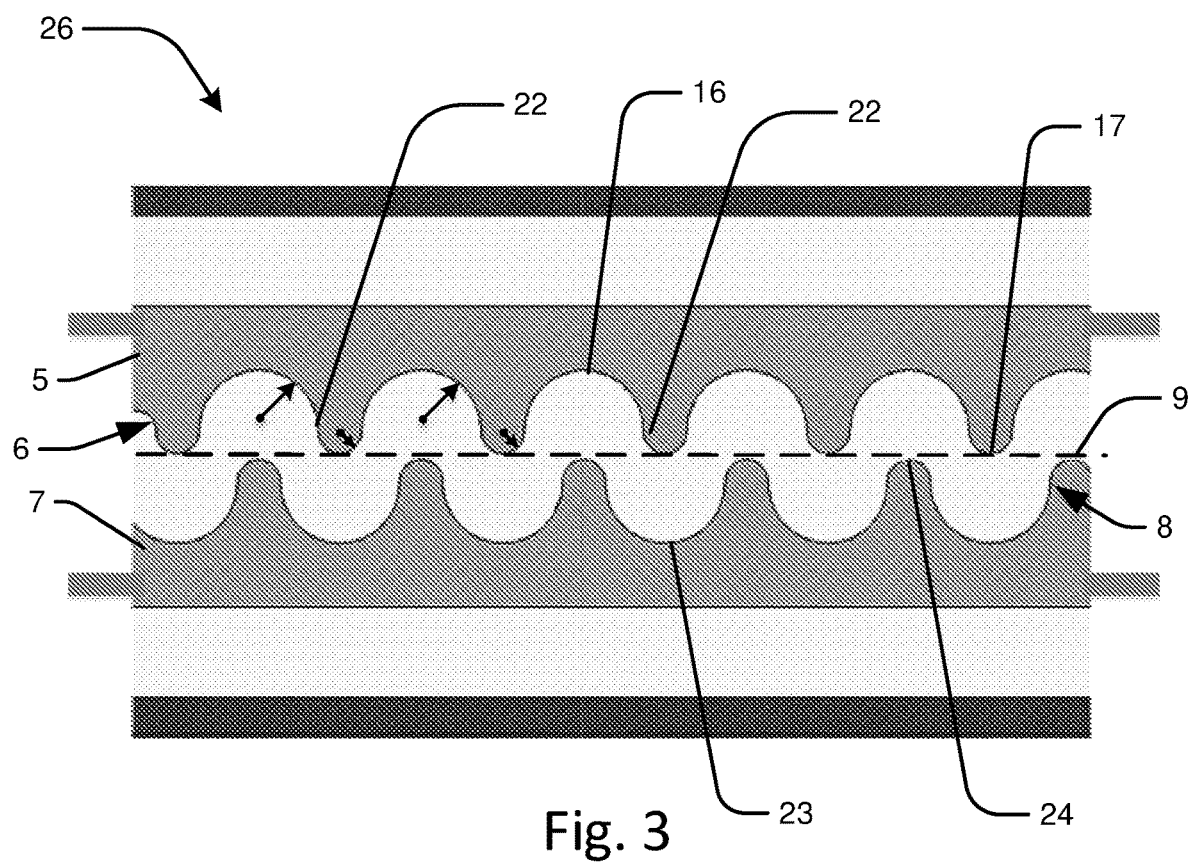
FIG. 3 is a plan view of a segment of a directional line coupler according to a further embodiment of the invention.

A coupler according to a further embodiment is illustrated in FIG. 3. In particular, a coupler 26 is similar to coupler 21 of FIG. 2 but with reduced straight line portions 22 and a reduced separation between edges 6 and 8. The formations 17 and 24 of edge 6 and 8 extend transversely from strips 5 and 7 respectively, and terminate just proximal to path 9. Accordingly, formations 17 and 24 are not interdigitated. The reduced straight line portions 22 result in formations 17 and 24 of reduced aspect ratio in comparison to the corresponding formations of coupler 21.

The inventors have found that the use of arcuate formations, as illustrated in the described embodiments, increases the breakdown potential between the first and second strips 5 and 7 in comparison with conventional sawtooth, rectangular and triangular formations. This allows for increased power handling of the coupler for a given thickness of conductive strips 5 and 7, thereby allowing thinner strips to be used for a given power handling requirement and separation 27 (FIG. 1) or 29 (FIG. 2). The use of thinner conductive strips 5 and 7 facilitates manufacturing of coupler 26 (FIG. 3) by reducing manufacturing time and the minimum spacing between strips 5 and 7 that can be reliably achieved using standard PCB manufacturing techniques. It has also been found that the configuration of formations 16, 17, 23 and 24 used in the described embodiments also increases the edge length over the conventional formations. This results in a corresponding reduction in aspect ratio of the formation required to equalise the odd and even mode phase velocities.

It will be appreciated the arcuate formations are not restricted to semi-circles. Although semi-circles are preferred, the above effect is achievable with other arcuate edge profiles. Preferentially, the edge includes a smooth contour and a gradient that is continuous. For example, the arcuate formations 16, 17, 23 and 24 are, in other embodiments, one or a combination of circle segments, sinusoids, parabolas etc.

Figure 4:
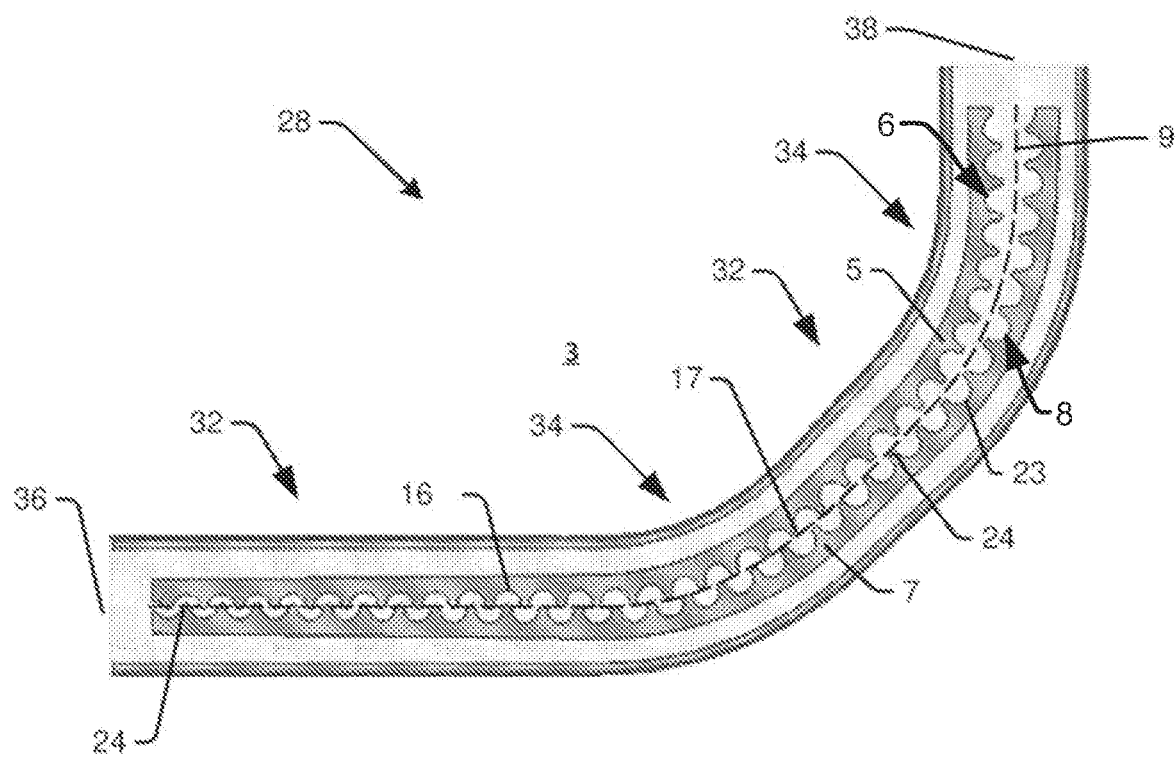
FIG. 4 is a plan view of a segment of a directional line coupler according to a further embodiment of the invention.
Figure 5:
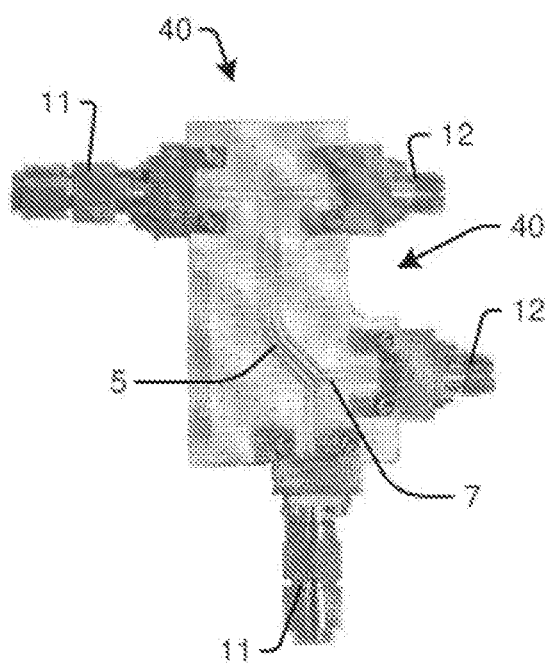
FIG. 5 is a plan view of a directional line coupler according to a further embodiment of the invention.

As mentioned above, in some embodiments path 9 includes curved sections resulting in a curved coupler. Examples of curved couplers are illustrated in FIGS. 4 and 5 as couplers 28 and 40 respectively. Turning initially to FIG. 4, coupler 28 includes path 9 which follows two generally straight sections 32 and two generally curved sections 34. It will be appreciated that by including curved sections 34 in path 9 that strips 5 and 7 are able to have an increased length for a given length of PCB 3 relative to which could be achieved with straight sections only. Therefore, inclusion of curved sections 34 in path 9 allows for coupler 28 to be fabricated on a smaller PCB 3 than would be possible if path 9 were linear. That is, curved sections 34 are able to be used to reduce the footprint of the coupler. Experimental results show that including curved sections in path 9 has a minimal effect on the coupling, ripple/flatness and directivity of coupler 28 when compared to a comparable coupler with a linear path 9.

Separation of edges 6 and 8 of coupler 28 varies along path 9 along with the offset of the centres of formations 16, 17, 23 and 24 as shown in FIG. 4. At a proximal end 36 of coupler 28 the separation is small and the formations 17 and 24 are interdigitated. The separation gradually increases along path 9 as the distance from end 36 increases. It will be noted that the formations at a distal end 38 of coupler 28 are not interdigitated. To maintain the offset and opposed relationship between formations 16 and 24—such that convex portions 24 remain diametrically opposed to concave portions 16—through curved sections 34, the radii of formations 23 and/or 24 in those sections are increased relative to opposing arcuate portions 16 and/or 17. Furthermore, through curved sections 34, formations 16, 17, 23 and 24 deviate from the more regular semi-circular shape to maintain a constant orientation of the formations relative to path 9.

In the design of coupler 28, the odd and even mode impedance varies or tapers along the coupler to achieve a desired coupling ratio and ripple (flatness) over the design bandwidth or frequency range. As the coupling decreases along the structure from end 36 to end 38, the odd mode velocity increases. To equalise with the even mode velocity the aspect ratio of the formations is increased from end 36 to end 38 to slow the odd mode velocity. Coupler 28 can be considered to be a linear combination of couplers 1 (FIG. 1), 26 (FIG. 3) and 21 (FIG. 2) connected in series. For example, end 36 of coupler 28 follows the general design of coupler 1, end 38 corresponds to the design of coupler 21 and the intermediate section corresponds to coupler 26. By combining couplers 1, 26 and 21, coupler 28 is able to act as a wide bandwidth non-uniform asymmetric line coupler.

In a preferred embodiment, the arcuate formations 16, 17, 23 and 24 in sections 34 are circle segments.

FIG. 5 illustrates another embodiment in the form of a curved coupler 40 and where corresponding features are denoted by corresponding reference numerals. The coupler is designed to be a quarter-wavelength in length at the centre design frequency, which is given by: (fmax+fmin)/2, where fmax is the highest design frequency and fmin is the lowest design frequency.

Strip 5 includes a connection terminal 11 for receiving the first RF signal from a first transmission component (now shown) such as a coaxial cable, waveguide or other such feed. Strip 7 includes a connection terminal 12 for allowing the second electromagnetic signal to be directed to a second transmission component (also not shown).

The minimum separation between edges 6 and 8 was modelled in electromagnetic simulation software, with the arcuate formations optimised for maximum isolation corresponding to equal phase velocities, and the conductor width optimised for maximum return loss (best impedance match to 50 Ohms or lowest VSWR). This provided the maximum coupling achievable and determined the maximum coupling of the broadband non-uniform coupler. Further computer modelling was used to optimise the geometry of the edges to achieve the desired odd and even mode impedances through coupling, isolation and return loss design targets. The performance in obtaining phase velocity match (observed as isolation) was then verified. The performance of the coupler was compared against a conventional coupler over a 20 GHz test range.

Although the embodiments described above utilise substantially similar first and second edges, it will be appreciated that in other embodiments at least one of the edges is substantially periodic such that the connected arcuate formations 16, 17, 23 and 23 define a periodic structure along path 9.

Furthermore, it will be appreciated that the various embodiments described above are exemplary and various combinations of these described embodiments would fall within the scope of the invention.

Although the invention has been described with reference to specific examples, it will be appreciated by those skilled in the art that the invention may be embodied in many other forms.

What is claimed is:

1. An electromagnetic coupler including:
   a substrate; and
   a pair of spaced apart electromagnetically coupled conductors mounted on the substrate,
   wherein each of the electromagnetically coupled conductors includes:
   at least one connector for providing or receiving an electromagnetic signal; and
   a respective smooth wiggly inner edge for substantially equalising even and odd-mode velocities of the electromagnetic signal, said respective smooth wiggly inner edge comprising a plurality of alternating convex and concave arcuate formations interconnected by an interleaved plurality of generally linear formations.

2. The coupler according to claim 1, wherein each of the respective smooth wiggly inner edges has a continuous gradient.

3. An electromagnetic coupler including:
   a substrate;
   a first conductor mounted to the substrate for receiving a first electromagnetic signal, the first conductor having a first edge comprising a first plurality of arcuate formations; and
   a second conductor mounted to the substrate, the second conductor being spaced apart from the first conductor and having a second edge comprising a second plurality of arcuate formations that are opposed to the first plurality of arcuate formations and are configured for generating in the second conductor a second electromagnetic signal that is derived from the first electromagnetic signal
   wherein for each of the first and second edges, the plurality of arcuate formations comprise a plurality of alternating convex and concave arcuate formations interconnected by an interleaved plurality of generally linear formations.

4. The coupler according to claim 3, wherein the first and second conductors co-extend along a curved path.

5. The coupler according to claim 4, wherein the curved path follows a compound curve.

6. The coupler according to claim 3, wherein the first and second edges substantially equalise even and odd-mode velocities for the electromagnetic signals.

7. The coupler according to claim 3, wherein each of the first edge and the second edge has a continuous gradient.

8. An electromagnetic coupler including:
   a substrate;
   a first conductor mounted to the substrate for receiving a first electromagnetic signal, the first conductor having a first edge including a first plurality of connected arcuate formations; and
   a second conductor mounted to the substrate, the second conductor being spaced apart from the first conductor and having a second edge that is opposed to the first edge, the second edge including a second plurality of connected arcuate formations,
   wherein for each of said first and second edges, said connected arcuate formations comprise a plurality of alternating convex and concave arcuate formations interconnected by an interleaved plurality of generally linear formations; and
   wherein:
   the first conductor and second conductor are each configured such that a second electromagnetic signal is generated in the second conductor; and
   the second electromagnetic signal is derived from the first electromagnetic signal.

9. The coupler according to claim 8, wherein the first edge and the second edge have continuous gradients.

10. The coupler according to claim 8, wherein alternate arcuate formations of each edge are of substantially the same radius of curvature.

11. The coupler according to claim 8, wherein the first edge and second edge are configured for substantially equalising even and odd-mode velocities of the electromagnetic signal.

12. The coupler according to claim 8, wherein the arcuate formations are substantially circular arcs.

13. The coupler according to claim 8, wherein the first conductor follows a first path and the second conductor follows a second path that is substantially coextensive with the first path.

14. The coupler according to claim 13, wherein the first and second paths are linear.

15. The coupler according to claim 13, wherein the first and second paths are curved.

16. The coupler according to claim 8, wherein the first edge and the second edge are substantially complementarily opposed with each other.

17. The coupler according to claim 16, wherein the first and second edges are interdigitated with each other.

* * * * *